(12) United States Patent
Matsunaga et al.

(10) Patent No.: US 7,184,309 B2
(45) Date of Patent: *Feb. 27, 2007

(54) NON-VOLATILE SEMICONDUCTOR MEMORY DEVICE

(75) Inventors: Yasuhiko Matsunaga, Kawasaki (JP); Toshitake Yaegashi, Yokohama (JP); Fumitaka Arai, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/965,775

(22) Filed: Oct. 18, 2004

(65) Prior Publication Data

US 2005/0047210 A1 Mar. 3, 2005

Related U.S. Application Data

(62) Division of application No. 10/090,995, filed on Mar. 6, 2002, now Pat. No. 6,859,394.

(30) Foreign Application Priority Data

Mar. 6, 2001 (JP) ................................ 2001-61489

(51) Int. Cl.
*G11C 16/04* (2006.01)
(52) U.S. Cl. .......................... 365/185.17; 365/185.18; 365/185.25
(58) Field of Classification Search ........... 365/185.17, 365/185.18, 185.25
See application file for complete search history.

(56) References Cited

U.S. PATENT DOCUMENTS

| | | | |
|---|---|---|---|
| 5,973,962 A * | 10/1999 | Kwon | ................... 365/185.18 |
| 6,011,287 A | 1/2000 | Itoh et al. | |
| 6,044,017 A * | 3/2000 | Lee et al. | .............. 365/185.18 |
| 6,049,494 A * | 4/2000 | Sakui et al. | ................. 365/203 |
| 6,061,270 A * | 5/2000 | Choi | ................... 365/185.025 |
| 6,064,611 A * | 5/2000 | Tanaka et al. | .............. 365/203 |
| 6,295,227 B1 * | 9/2001 | Sakui et al. | ........... 365/185.17 |
| 6,370,062 B2 * | 4/2002 | Choi | ..................... 365/185.23 |

FOREIGN PATENT DOCUMENTS

| | | |
|---|---|---|
| JP | 8-279297 | 10/1996 |
| JP | 10-283788 | 10/1998 |

* cited by examiner

*Primary Examiner*—Huan Hoang
(74) *Attorney, Agent, or Firm*—Oblon, Spivak, McClelland, Maier & Neustadt, P.C.

(57) ABSTRACT

A non-volatile semiconductor memory device having a write mode in which wrong writing is prevented surely. The storage device comprises a NAND cell comprising a plurality of memory transistors connected in series and also connected at one end via a select gate transistor CG1 to a bit line BL and at the other end via a select gate transistor SG2 to a common source line SL. A write voltage Vpgm is applied to a control gate of a selected memory transistor in the NAND cell and Vss is applied to the controls gates of non-select memory transistors each adjacent to the selected memory transistor to thereby write data into the select memory transistor. When a second memory transistor from the bitline BL side is selected in the writing operation, a medium voltage Vpass is applied to the control gate of a first non-selected memory transistor from the bit line BL side, and a medium voltage Vpass is applied to the control gates of third and subsequent non-selected memory transistors from the bit line BL side.

21 Claims, 12 Drawing Sheets

NON-VOLATILE SEMICONDUCTOR MEMORY DEVICE

CROSS-REFERENCE TO RELATED APPLICATIONS

This application is a Divisional of U.S. patent application Ser. No. 10/090,995, filed Mar. 6, 2002, now U.S. Pat. No. 6,859,394, and is based upon and claims the benefit of priority from the prior Japanese Patent Application No. 2001-061489, filed Mar. 6, 2001. The contents of these applications are incorporated herein by reference.

BACKGROUND OF THE INVENTION

The present invention relates to electrically writable non-volatile semiconductor devices (EEPROMs), and more particularly to an EEPROM employing a NAND type cell array.

In the past, NAND-type flash EEPROMs are known as highly integratable EEPROMs. Memory transistors arranged in rows columns and composing a NAND-type flash EEPROM each have a stacked gate structure of a charge storage layer (a floating gate), formed on a semiconductor substrate through an insulting film, and a control gate. The memory transistors in each row or column are connected in series such that any adjacent transistors share a source and drain diffusion layer. Each string of such series-connected transistors has a pair of select gate transistors one provided at each end thereof. Thus, a NAND cell (unit) is formed.

Each of the transistors stores data in a non-volatile manner in a charge storage state of the floating gate thereof. More specifically, it stores binary data, that is, data "0" involving a high threshold voltage representing that electrons have been injected into the floating gate from a channel thereof, and data "1" involving a low threshold voltage representing that electrons have been discharged from the floating gate to the channel. Recently, a multivalued storage system, for example, involving four numerical values including subdividing threshold distribution control is employed.

In data writing, data stored in all the memory transistors of the NAND cell block is beforehand erased collectively. This is performed by applying a voltage Vss to all the control gate lines (word lines) of a selected NAND cell block, and a positive boosted voltage (erasing voltage) to a p-type well of the cell array to cause electrons in the respective floating gates of the memory transistors to discharge into their channels. Thus, data in all the memory transistors of the NANDcell block is set to "1" (erased state)

After erasing all the data collectively in the respective NAND cells, data writing is sequentially performed collectively into the memory transistors of the NAND cell arranged along the respective selected control gate lines, starting with the memory transistors arranged along the control gate line nearest the source line usually, referred to as a page. When a positive boosted voltage Vpgm is applied to a selected word line, electrons are then injected into a floating gate of the selected memory transistor from a channel in the NAND cell (so-called "0 write") in the case of "0" data writing. In the case of "1" data writing, electron injection is inhibited (so-called "write inhibit" or "1" write).

Data writing into the respective memory transistors of each NAND cell is performed by controlling the channel potential of a selected memory transistor depending upon write data "0" or "1". For example, in the case of data "0" writing, the channel potential is kept low. Thus, when the write voltage is applied to the control gate of the selected memory transistor, its floating gate is boosted to thereby cause electron injection into the floating gate. In the case of "1" data writing (or write inhibit), the channel potential is boosted to thereby inhibit electron injection into the floating gate.

There are various systems for controlling channel potentials in the case of data writing. A self-boost system is known in the past, in which when "1" data is to be written, the channel of a selected memory transistor is placed in a floating state and the channel potential is boosted by capacitive coupling of the channel to the control gate. More particularly, before the write voltage is applied to the control gate line, Vss or Vdd is applied to a bit line depending upon write data "0" or "1" to turn on a selected gate transistor on the bit line side and to turn off a selected gate transistor on the source side. Thus, when "0" data is to be written, Vss is transferred to the NAND cell channel. When "1" data is to be written, the NAND cell channel is precharged to a potential equal to the voltage (for example, Vdd+α) applied to the gate of the selected gate transistor minus the threshold voltage of the selected gate transistor to thereby place the NAND cell channel in a floating state.

Then, when the write voltage is applied to the selected gate line, a high field is applied across a gate insulating film underlying the floating gate and electrons are, for example, tunnel injected into the floating gate because the channel of the selected memory transistor is clamped to the low voltage Vss in the case of "0" data writing. In the case of "1" data writing, the channel of a selected memory transistor in the floating state is boosted through capacitive coupling to the control gate of the selected memory transistor. More specifically, one write voltage (for example, of 20V) applied to the selected control gate line and a plurality of medium voltages (for example, of 10V) applied to a plurality of non-selected control gate lines cause capacitive coupling to boost the channel potential to 6V to thereby produce a voltage difference of 14V between the channel and the selected control gate line. Thus, writing is inhibited.

As another example of the self-boost system, a special system has been proposed in which all the memory transistors of a NAND cell arranged between its selected memory transistor and the bit line are boosted as a unit (Japanese Patent Laid Open No. 10-283788). In this case, Vss is applied to the control gate of a memory transistor adjacent to the source electrode of the selected memory transistor to cut off its channel. A write voltage is then applied to the control gate of the selected memory transistor. A medium voltage is applied to the control gates of the other memory transistors.

This cuts off the channels of the written memory transistors arranged on the source side from the selected memory transistor. When data to be written into the selected memory transistor is '0', Vss is transferred to the channel of the selected memory transistor and electrons are injected into the floating gate of the selected memory transistor. Since the medium voltage is applied to the control gates of the memory transistors arranged on the bit line from the selected memory transistor, no electron injection occurs in those memory transistors. When the write data is "1", the channel of the selected memory transistor and the other memory transistors arranged on the bit line from the selected memory transistor can be capacitively coupled together to their control gates to thereby boost the channels to inhibit electron injection.

Recently, the self-boost system used generally is a Local Self-Boost (LSB) system. Referring to FIG. 5, this system will be explained when "1" data is to be written. Two memory transistors provided one on each side of a selected memory transistor are turned off. Thus, only the channel of the selected memory transistor is placed in a floating state where it is cut off from other memory transistors to thereby boost the channel of the selected memory transistor. A medium voltage is applied to the control gates of the memory transistors other than the three memory transistors (including the selected memory transistor and the adjacent memory transistors).

Also, in this case Vss is transferred from a "0"-write bit line to the channel of the selected memory transistor. When the write voltage is applied to the control gate of the selected memory transistor, electrons are injected into the floating gate thereof. In the case of a "1" write bit line, the two memory transistors arranged one adjacent to each side of the selected transistor are respectively turned off and only the channel of the selected memory transistor is placed in a floating state. Only the channel of the selected memory transistor is boosted by capacitive coupling to the control gate so that electron injection is inhibited.

As described above, a multivalued system is also used as a data storing system for an NAND type flash EEPROM. This system has a merit over a binary system that compared to the binary system the former system is capable of recording a double quantity of data in a memory cell array having the same area as the binary system. However, the former system also has a drawback that write control is difficult necessarily because a range of threshold voltages of memory transistors to be used for data recording expands. For example, in the case of "1" writing, the channel potential of the memory transistor concerned is insufficient, so that wrong writing involving wrong injection of electrons into the floating gate of the memory transistor can occur. It is very important to prevent such wrong writing. Especially, the LSB system is greatly expected as being capable of preventing wrong writing when a multivalued storage system is employed.

In the LSB system, when "1" data is to be written, the channel of the selected memory transistor is boosted by tuning off the two memory transistors disposed one adjacent to each side of the selected memory transistor. At this time, if the two adjacent memory transistors can be completely cut off, the boost area is limited to the channel and diffusion layer of the selected memory transistor. Thus, the narrow area only needs to be boosted with a write voltage Vsgm. Therefore, there is a probability that the channel can be boosted efficiently.

With this LSB system, however, when "1" is to be written into a second memory transistor from the bit line or a common source line, situations are different in writing from those with the other memory transistors. Therefore, there is a probability that the channel will be boosted insufficiently which will be described more specifically next with reference to FIGS. 12 and 13.

FIGS. 12 and 13 each shows a relationship among voltages applied to the respective control gates of the memory transistors of the NAND cell, and boosting of the channels of third and second selected memory transistors, respectively, from the bit line side. As shown in FIG. 12, when the third memory transistor is selected by a control gate line CG2, Vss=0 V is applied to control gate lines CG1 and CG3 each adjacent to the control gate line CG2, and a medium voltage Vpass is applied to the respective other control gate lines CG0, CG4, . . .

If at this time the medium voltage Vpass applied is, for example, 10 V and a capacitive coupling ratio is 50%, the channel underlying the control gate line CG0 is boosted to about 5 V. The channel underlying the control gate line CG0 functions as a source of the second memory transistor to which Vss was applied. The gate-source voltage of the second memory transistor becomes −5V. If the threshold of this memory transistor in an erased state is higher than −5 V, the memory transistor is turned off. Likewise, the channel of a fourth memory transistor to be controlled by the control gate line CG3 is also turned off.

Thus, the channel, shown hatched, (including the source and drain electrons) of the third memory transistor to which the write voltage Vpgm is applied is placed in a floating state and boosted by the write voltage Vpgm.

In contrast, when a second memory transistor (on control gate line CG1) from the bit line side is selected, situations shown in FIG. 13 appear. Vss is applied to a control gate line CG0 adjacent to the control gate line CG1 on the bit line side. A diffusion layer of the memory transistor functioning as its source on the control gate line CG0 on the select gate transistor side has a potential Vdd-Vth (where Vth is a threshold voltage of the select gate transistor) because Vdd has been applied to the selected gate line SGD. If, for example, Vdd=3 V and Vth=1 V, the gate-source voltage of the memory transistor on the control gate line CG0 is −2 V. If the threshold voltage of the memory transistor in an erased state is lower than −2 V, the first memory transistor to which Vss is applied via the control gate line CG0 is not turned off.

Thus, the channel to be boosted by the write voltage Vpgm applied to the selected control gate line CG1 is shown by a hatched area that unites the channels of the two memory transistors on the control gate lines CG0 and CG1. In other words, the channel having a double area compared to FIG. 12 must be boosted by the write voltage Vpgm. As a result, the boosting efficiency will decrease, which would lead to wrong writing involving electron injection into the floating gate.

Similar situations will also occur when a second memory transistor on the common source side is selected.

A tendency to subdivision has brought about the gate lengths of the memory transistors reaching a gradation of submicrons, which makes it difficult to get a good cutoff characteristic actually. From a standpoint of process, the tendency to subdivision thins the gate of a memory transistor provided at each end of a NAND cell in lithography. This causes uneven lengths of the gates due to processing to deteriorate the cutoff characteristic. Thus, it is expected that the above problems will more and more remarkable from now on.

SUMMERY OF THE INVENTION

According to the embodiment of the present invention, there is provided a non-volatile semiconductor memory device comprising:

(1) a memory cell array which comprises a NAND cell, the NAND cell comprising:

a plurality of memory transistors connected in series, each memory transistor comprising a charge storage layer and a control gate;

a first select gate transistor through which the series connected plurality of memory transistors is connected at one end to a bit line; and a second select gate transistor through which the series connected plurality of memory transistors is connected at the other end to a common source line, wherein in a data write mode, a write voltage is applied to a control gate of a selected one of the plurality of memory transistors of the NAND cell, and a reference voltage is applied to respective control gates of the two memory transistors each adjacent to the selected memory transistor, to thereby turn off the one of the two adjacent memory transistors on the common source line side, and to turn off or on the one of the two adjacent memory transistors on the bit line side depending upon whether data 1 or 0 is applied to the bit line; and (2) a voltage applying circuit for, when a second one of the memory transistors of the NAND cell from the bit line side is selected in the data write mode, applying a write voltage to a control gate of the second memory transistor from the bit line side, a reference voltage to a control gate of a third memory transistor, which being non-selected, from the bit line side, a first medium voltage lower than the write voltage and higher than the reference voltage to a control gate of a first memory transistor, which being non-selected, from the common source line side, and a second medium voltage lower than the write voltage and higher than the reference voltage to at least one of the remaining memory transistors, which being non-selected.

According to the embodiment of the present invention, there is also provided a non-volatile semiconductor memory device comprising:

(1) a memory cell array which comprises a NAND cell, the NAND cell comprising:
a plurality of memory transistors connected in series, each memory transistor comprising a charge storage layer and a control gate;
a first select gate transistor through which the series connected plurality of memory transistors is connected at one end to a bit line; and
a second select gate transistor through which the series connected plurality of memory transistors is connected at the other end to a common source line,
wherein in a data write mode, a write voltage is applied to a control gate of a selected one of the plurality of memory transistors, of the NAND cell, and a reference voltage is applied to respective control gates of the two memory transistors each adjacent to the selected memory transistor, to thereby turn off the one of the two adjacent memory transistors on the common source line side, and to turn off or on the one of the two adjacent memory transistors on the bit line side depending upon whether data 1 or 0 is applied to the bit line; and (2) a voltage applying circuit for, when a second one of the memory transistors of the NAND cell from the common source line side is selected in the data write mode, applying a write voltage to a control gate of the second memory transistor from the common source line side, a reference voltage to a control gate of a third memory transistor, which being non-selected, from the common source line side, a first medium voltage lower than the write voltage and higher than the reference voltage to a control gate of a first memory transistor, which being non-selected, from the common source line side, and a second medium voltage lower than the write voltage and higher than the reference voltage to at least one of the remaining memory transistors, which being non-selected.

According to the embodiment of the present invention, there is also provided a non-volatile semiconductor memory device comprising:

(1) a memory cell array which comprises a NAND cell, the NAND cell comprising:
a plurality of memory transistors connected in series, each memory transistor comprising a charge storage layer and a control gate;
a first select gate transistor through which the series connected plurality of memory transistors is connected at one end to a bit line; and
a second select gate transistor through which the series connected plurality of memory transistors is connected at the other end to a common line; and (2) a voltage applying circuit for, when a K-th one of the plurality of memory transistors of the NAND cell from the bit line side is selected in a write mode,
applying a write voltage to a control gate of the K-th memory transistor,
applying a reference voltage to control gates of two (K−m)th and (K+m)th memory transistors (where m and n are integers at least one of which is 2 or more), which being non-selected, from the bit line side, to thereby turn off the (K+n)th memory transistor and to turn on the (K−m)th memory transistor depending upon data "1" or "0"applied to the bit line;
the selected memory transistor and at least any one of two memory transistors disposed one adjacent to each side of the selected memory transistor intervening between the two memory transistors, which being non-selected;
applying a first medium voltage lower than the write voltage and higher than the reference voltage to the control gates of the memory transistors, which being non-selected, intervening between the two memory transisters, which being non-selected; and
applying a second medium voltage lower than the write voltage and higher than the reference voltage to the control gate of at least one of the memory transistors, which being non-selected, on the bit line side from the (K−m) th memory transistor and to the control gate of at least one of the memory transistors, which being non-selected, on the common source line side from the (K+n)th memory transistor.

BRIEF DESCRIPTION OF THE DRAWINGS

FIG. 10 illustrates a relationship among voltages used in the write operation to be performed in the last-mentioned embodiment, wherein

FIG. 11 illustrates a relationship among voltages in the write operation to be performed when a first memory transistor and a second memory transistor from the bit line side are selected, in the last-mentioned embodiment, wherein

DETAILED DESCRIPTION OF THE INVENTION

Embodiments of the present invention will be now described with reference to the accompanying drawings.

Figure 1:
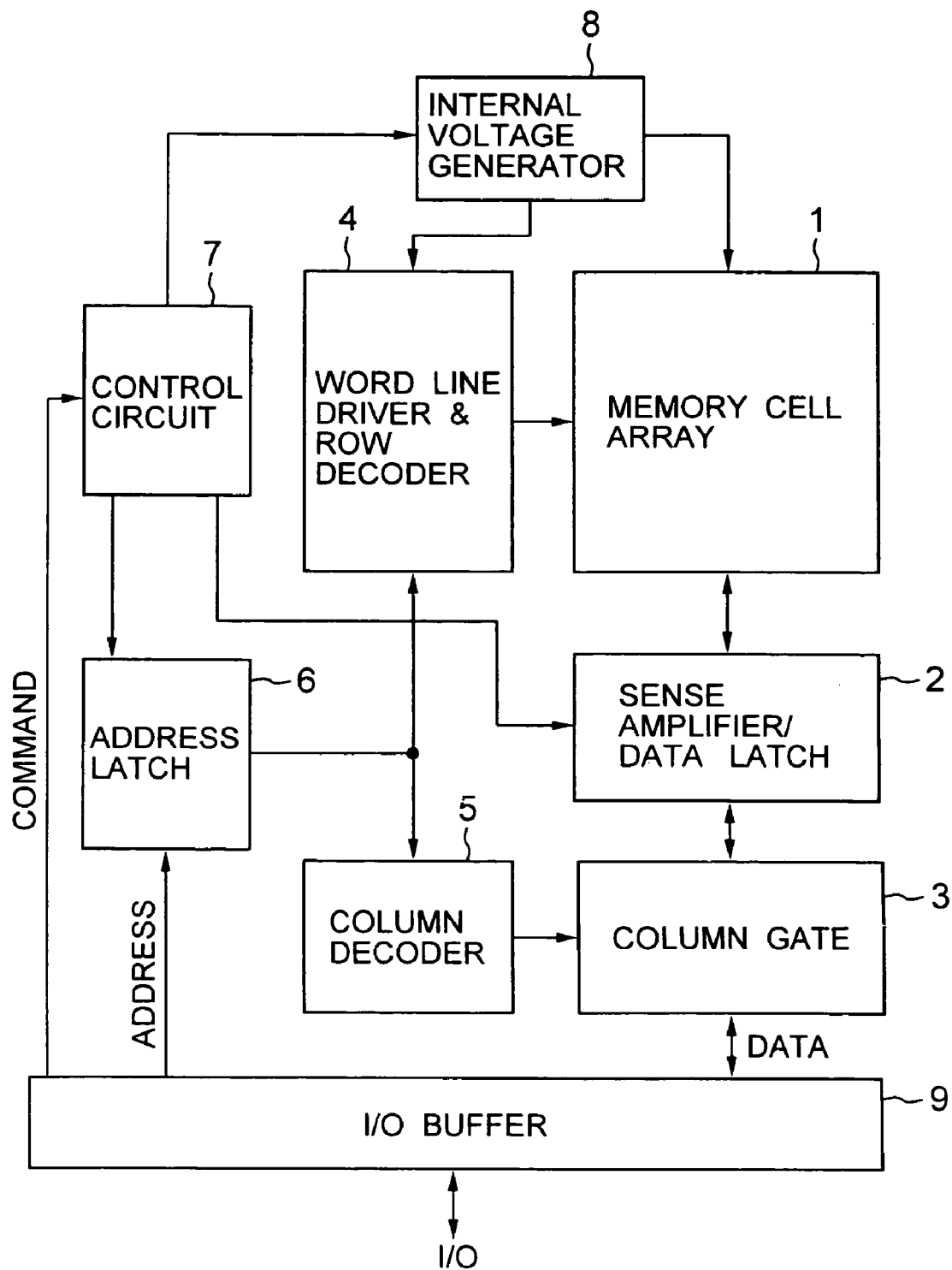
FIG. 1 shows a structure of an EEPROM as one embodiment of the present invention.
Figure 2:
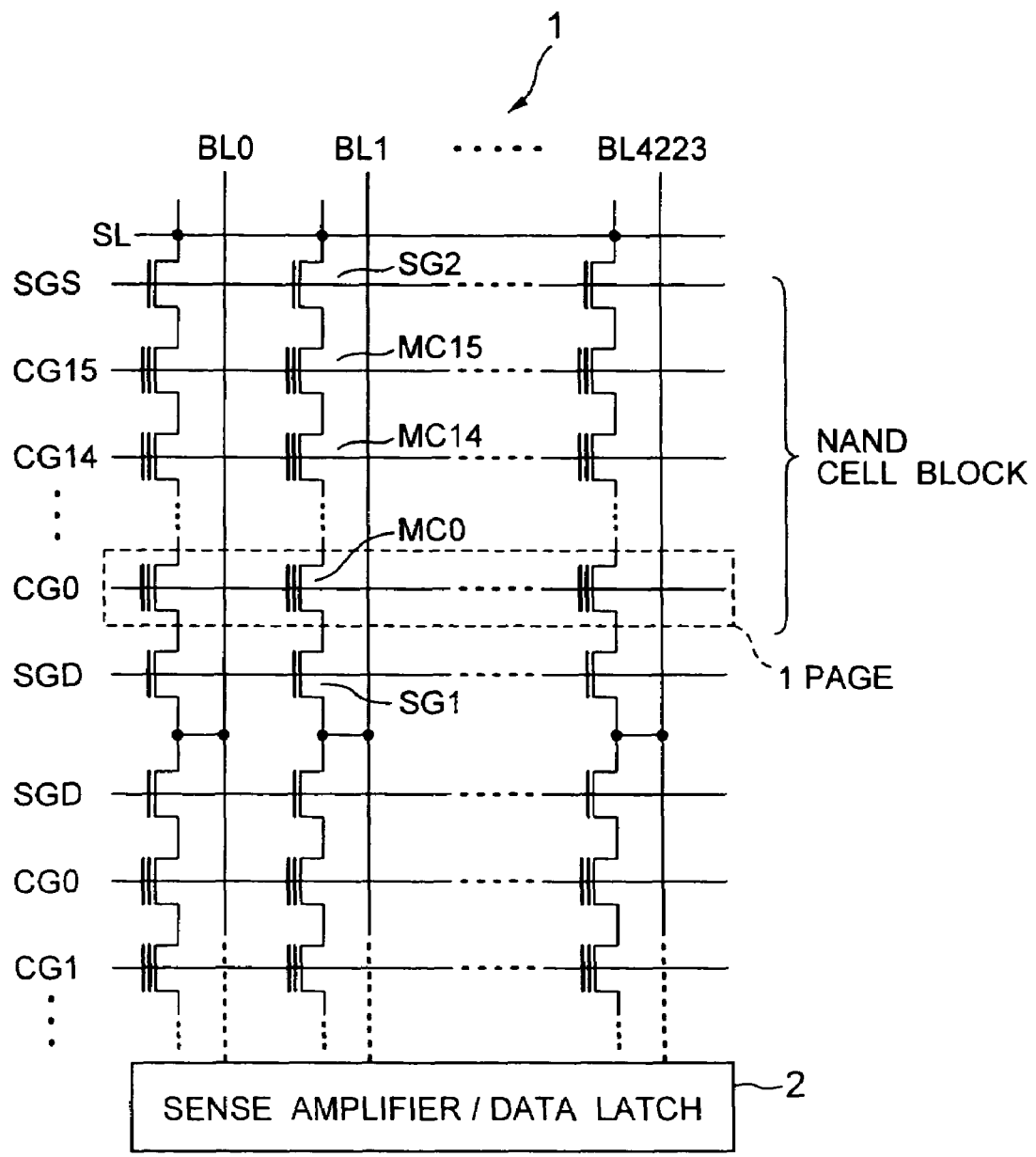
FIG. 2 shows a structure of a memory cell array of the EEPROM.

FIG. 1 illustrates a structure of a NAND type EEPROM according to one embodiment of the present invention. As shown in FIG. 2, a memory cell array 1 is composed of a plurality of NAND cell blocks. Each block comprises a plurality of NAND cells (or units). Each cell comprises a plurality of (16, in the shown embodiment) memory transistors MC (MC0–MC15) connected in series so that adjacent memory transistors have shared a source and drain diffusion layer with each other. Each memory transistor MC is a MOSFET having a stacked gate structure of superimposed floating and control gates. Each NAND cell is connected at one end through a select gate transistor SG1 to a bit line BL and at the other end through a select gate transistor SG2 to a common source line SL.

Control gates of memory transistors MC arranged in each row are connected in common to a corresponding one of control gate lines (word lines) CG (CG0–CG15). The gates of the select gate transistors SG1 and SG2 are likewise connected in common to the corresponding select gate lines SGD and SGS extending in row directions, respectively.

The memory transistors connected to a single control gate line CG are the ones to which data will be written collectively and constitute one page. The NAND cells arranged in columns constitute a NAND cell block (or unit) from which data will be erased collectively.

Each of the bit lines BL of the memory cell array 1 is connected to a sense amplifier/data latch circuit 2 that senses data to be read out and latches data to be written. The sense amplifier/data latch circuit 2 is connected to an I/O buffer 9 via a column gate 3 which will be driven by a column decoder 5.

A row decoder/word line driver 4 selects and drives a respective one of the control gate lines of the memory array 1. An external address is held by an address latch 6 and delivered to the column decoder 5 and the row decoder/word line driver 4. An internal voltage generator 8 is a booster that generates a write voltage Vpgm delivered to a control gate line selected at a time of data writing, an eraser voltage Vera delivered to the well at a time of data erasing, and a medium voltage Vpass lower than those voltages but higher than a power supply voltage Vdd. A control circuit 7 controls data writing, subsequent data verify reading, data erasing and subsequent data verify reading.

In this embodiment, the LSB system is basically used for boosting the channel when "1" data is to be written. It is to be noted that only when a second memory transistor from an associated bit line BL is selected and a second memory transistor from an associated common source line SL is selected, a channel boosting control is provided which is different from that provided when other respective memory transistors are selected. A specified embodiment for performing this operation will be described next.

Embodiment 1

Figure 3:
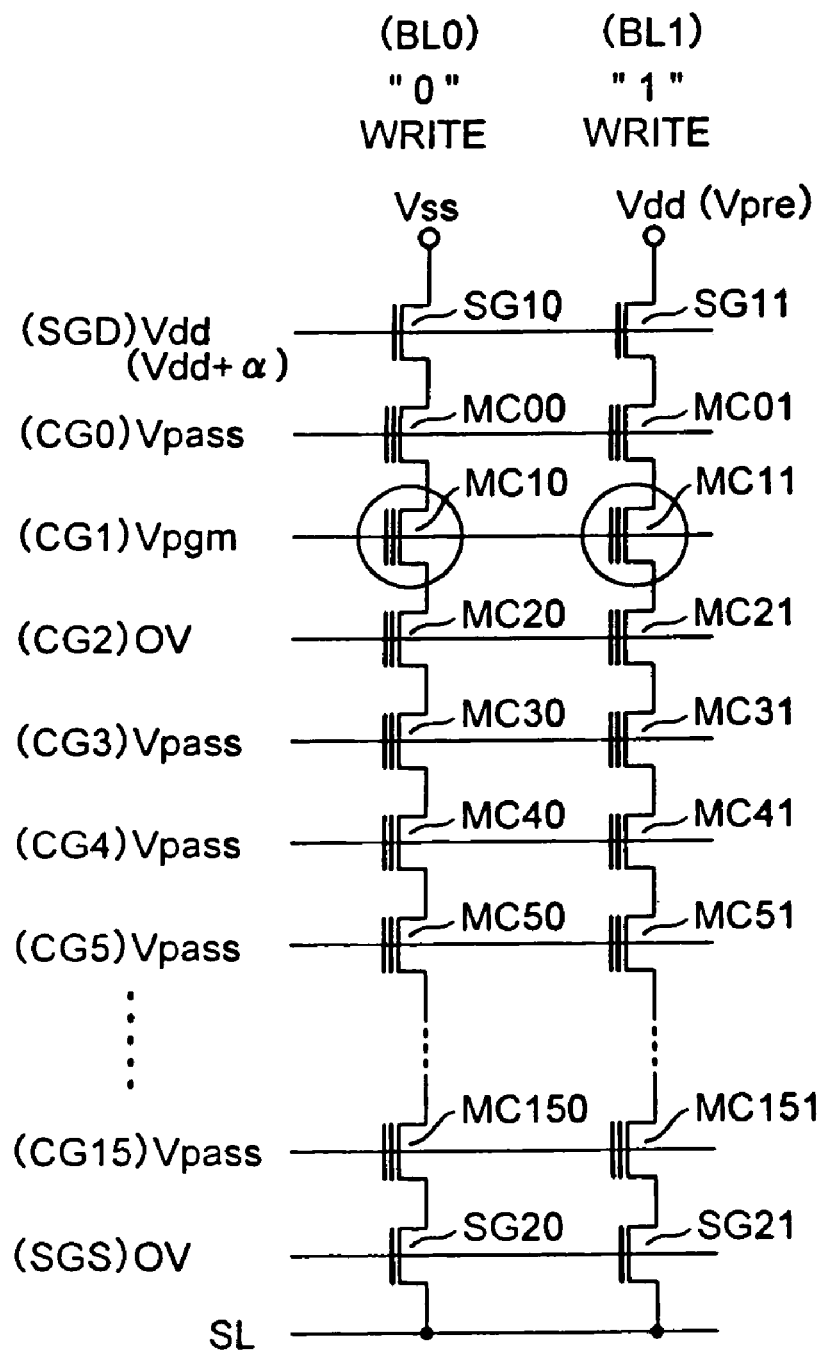
FIG. 3 shows a relationship among voltages applied to be the respective select and control gate lines in a write operation to be performed when a CG1 is selected in the embodiment.

FIG. 3 shows a relationship among voltages applied to the NAND cells for two bit lines BL0 and BL1 when data is written to second memory transistor from the bit lines BL0 and BL1. FIG. 3 also shows that "0" and "1" data are given to the bit lines BL0 and BL1, respectively.

Before data writing, old data stored in the NAND cell block is erased collectively. Thus, all the memory transistors of the block are placed in an all–"1" state where the thresholds are low (for example, negative). Then, "0" or "1" write data is given from the sense amplifier/data latch 2 to the bit lines BL and written sequentially into the respective pages of memory transistors, starting with the page nearest to the common source line SL. At this time, before application of the write voltage, Vss=0 V and a boosted voltage Vpre higher than Vdd are given to the bit lines BL0 and BL1, respectively. At this time, by applying Vdd+α and Vss to the bit-line side select gate line SGD and the select gate line SGS adjacent to the common source line SL, respectively, the channels of the two NAND cells on the sides of bit lines BL0 and BL1 are precharged to low and high levels, respectively.

Thus, the channel of the NAND cell on the side of the bit line BL0 to which the "0" data has been applied is set to a low level Vss whereas the channel of the NAND cell on the side of the bit line BL1 to which the "1" data has been applied is precharged to Vdd or higher. After that, the voltage of the bit line side select gate line SGD is changed from Vdd+α to Vdd. Thus, the select gate transistor SG11 is turned off on the bit line BL1 side, so that the channel of the NAND is placed in the floating state of high level.

After such channel precharging, a write voltage Vpgm (for example, of 20 V) is applied to a selected second control gate line CG1, as shown in FIG. 3. At this time, Vss is applied to a third control gate line CG2 from the bit lines whereas a medium voltage Vpass (for example, of 10 V) lower than the write voltage Vpgm is applied to the control gate line CG0 nearest to the bit lines BL, which is different from the general LSB system. The medium voltage Vpass is applied to all the other control gate lines CG3, CG4, ..., and CG15 after the third control gate line.

The reason why the medium voltage Vpass is applied to the control gate lines CG3, CG4, ..., and CG15 is to apply the voltage of the control gate to the substrate through capacitive coupling to thereby surely cut off the channel of a non-selected memory transistor MC21 adjacent to the selected memory transistor MC11 in the NAND cell connected to the bit line BL to which "1" data is applied. Thus, application of the medium voltage Vpass to all these control gate lines is not necessarily required. The medium voltage may be instead applied to at least one of those control gate lines and Vss may be applied to the remaining control gate lines.

According to such write conditions, the channels extending from at least the bit line BL to the selected memory transistor MC10 are placed in a low-potential conductive state in the NAND cell connected to the bit line BL0 to which the "0" data is applied. Thus, in the selected memory transistor MC10 a high field is applied across a gate insulating film underlying the floating gate, and electrons are injected from the channel to the floating gate. That is, "0" writing is performed. The memory transistor MC00 is turned on or off depending upon write data, but no data writing occurs in either case. In addition, no high field is applied to the memory transistors MC30–MC150 and no data writing occurs on the source line side from the memory transistor MC00.

Figure 4:
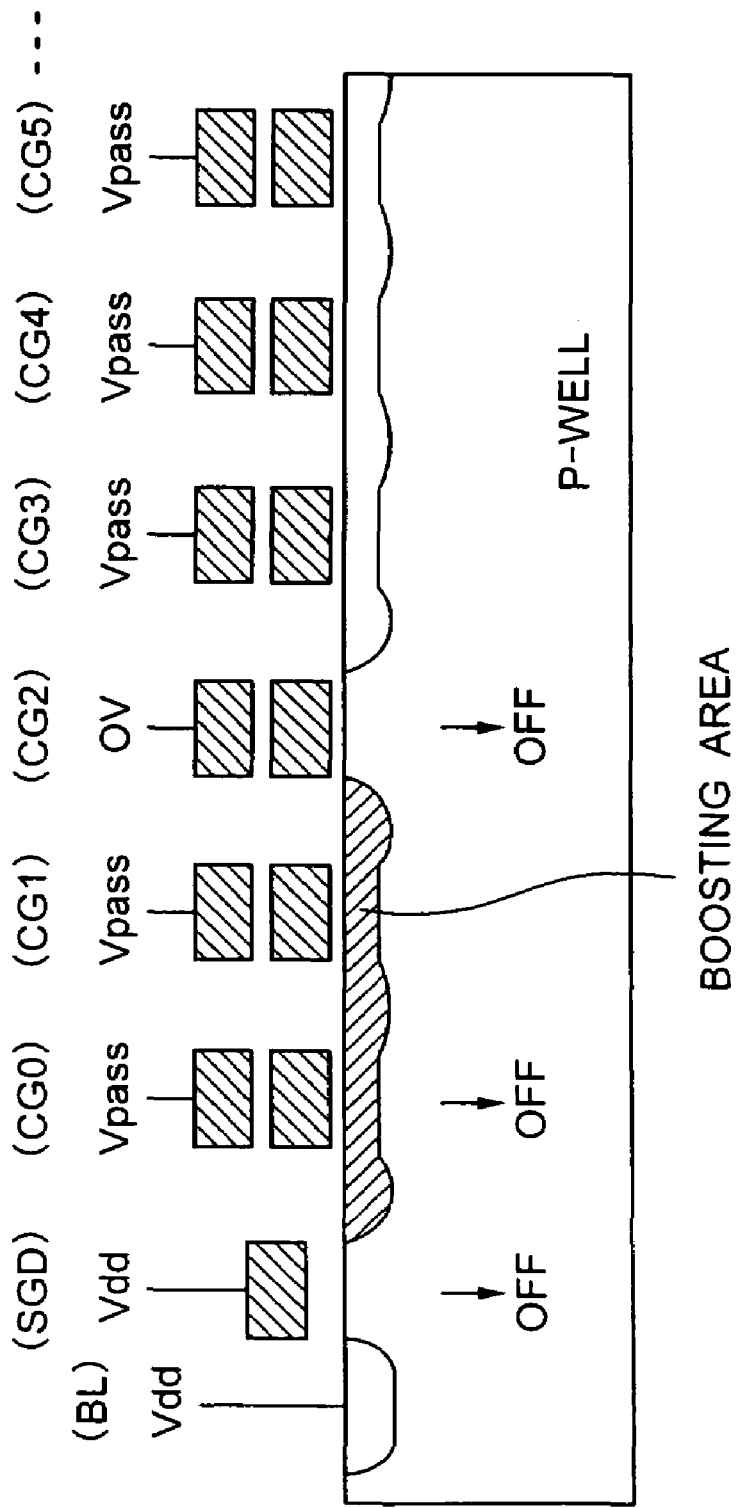
FIG. 4 illustrates boosting a channel on a "1" write side in the embodiment.
Figure 13:
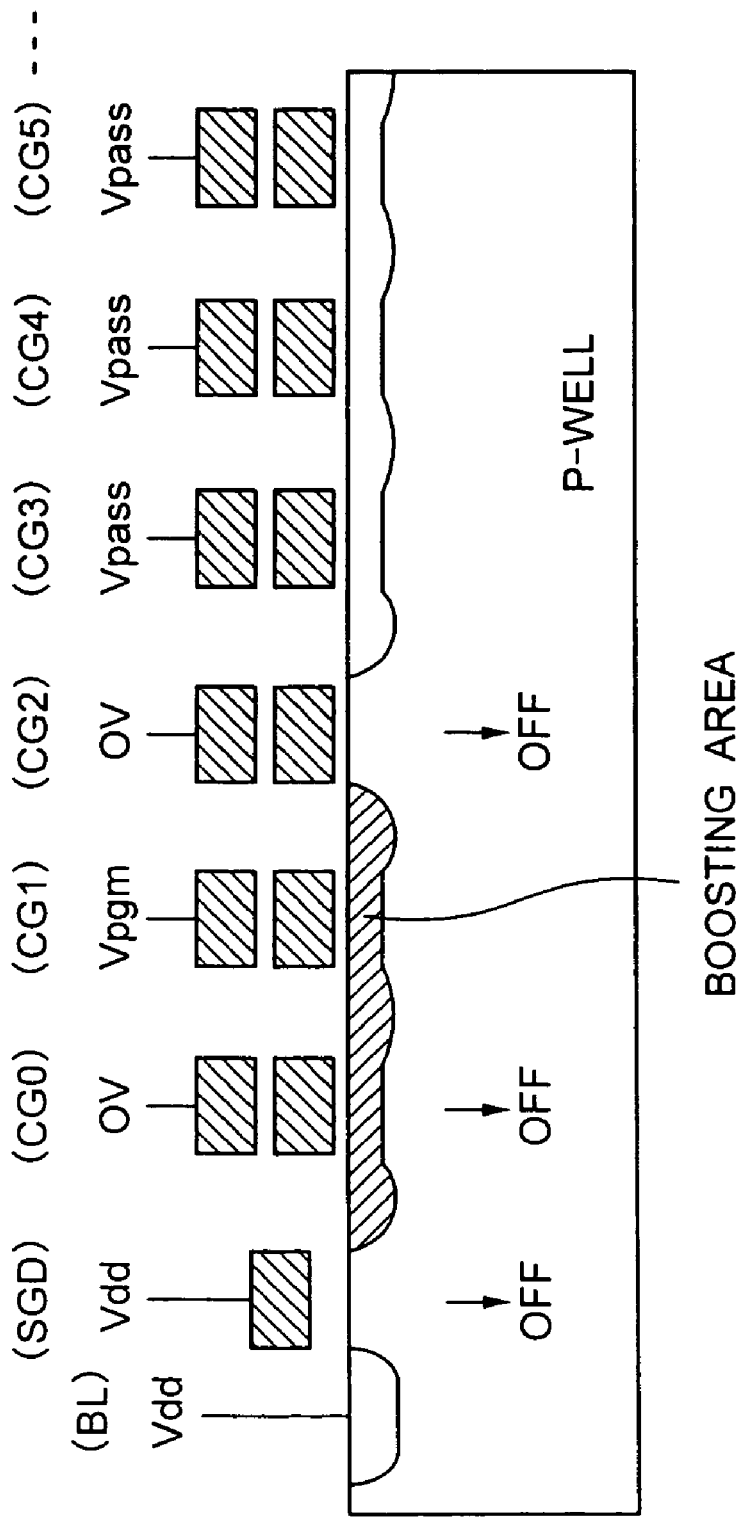
FIG. 13 illustrates boosting of channels when a CG1 is selected in the prior art system.

The selected memory transistor MC11 in the NAND cell connected to the bit line BL1 to which the "1" data is applied operates as follows. The channel of the selected memory transistor MC11 in a floating state is boosted by capacitive coupling to its control gate. Thus, electron injection into the floating gate is inhibited and the "1" data is held. The situation in which the channel in the NAND cell at this time is boosted is illustrated in FIG. 4 in correspondence to FIG. 13 of the prior art. As described above, when the second memory transistor MC11 from the bit line BL1 is selected, the first memory transistor MC01 from the bit line BL1 may not be turned off even when Vss is applied to the control gate thereof. Therefore, as in FIG. 13, the two channels of the memory transistors MC11 and MC01 are connected in a floating state and must be boosted as a unit.

With this embodiment, the write voltage Vpgm is applied to the memory transistor MC11 whereas the medium voltage Vpass is applied to the memory transistor MC01 adjacent to the memory transistor MC11 on the bit line side. Thus, a hatched boost area of FIG. 4 is boosted to a potential higher than in the prior art. This inhibits electron injection in the selected memory transistor MC11 securely. The memory transistor MC21 connected to the control gate line CG2 adjacent to the selected control gate line CG1 on the source line side is already written and the medium voltage Vpass is applied to the control gate line CG3 adjacent to the memory transistor MC21 on the source side. Thus, the memory transistor connected to the control gate line CG3 is turned off when Vss is applied thereto, as in the prior art.

When the second control gate line CG1 from the bit lines BL is selected, an adjacent coupling effect can be reduced by applying the medium voltage Vpass to the first control gate line CG0. More specifically, the write voltage Vpgm may be applied to the selected control gate line CG1 and Vss to the control gate line CG0 adjacent to the control gate line CG1 on the bit line side. In this case, the floating gates of the memory transistors connected to the control gate line CG1 cannot be boosted to a potential high enough to write "0" therein due to capacitive coupling from the control gate line CG0 to which Vss is applied. Thus, the "0" writing speed in the "0" write cell is reduced. In contrast, if the medium voltage Vpass is applied to the control gate line CG0, the potentials of the floating gates of the memory transistors on the selected control gate line CG1 are increased to thereby provide a sufficient "0" writing speed.

Figure 5:
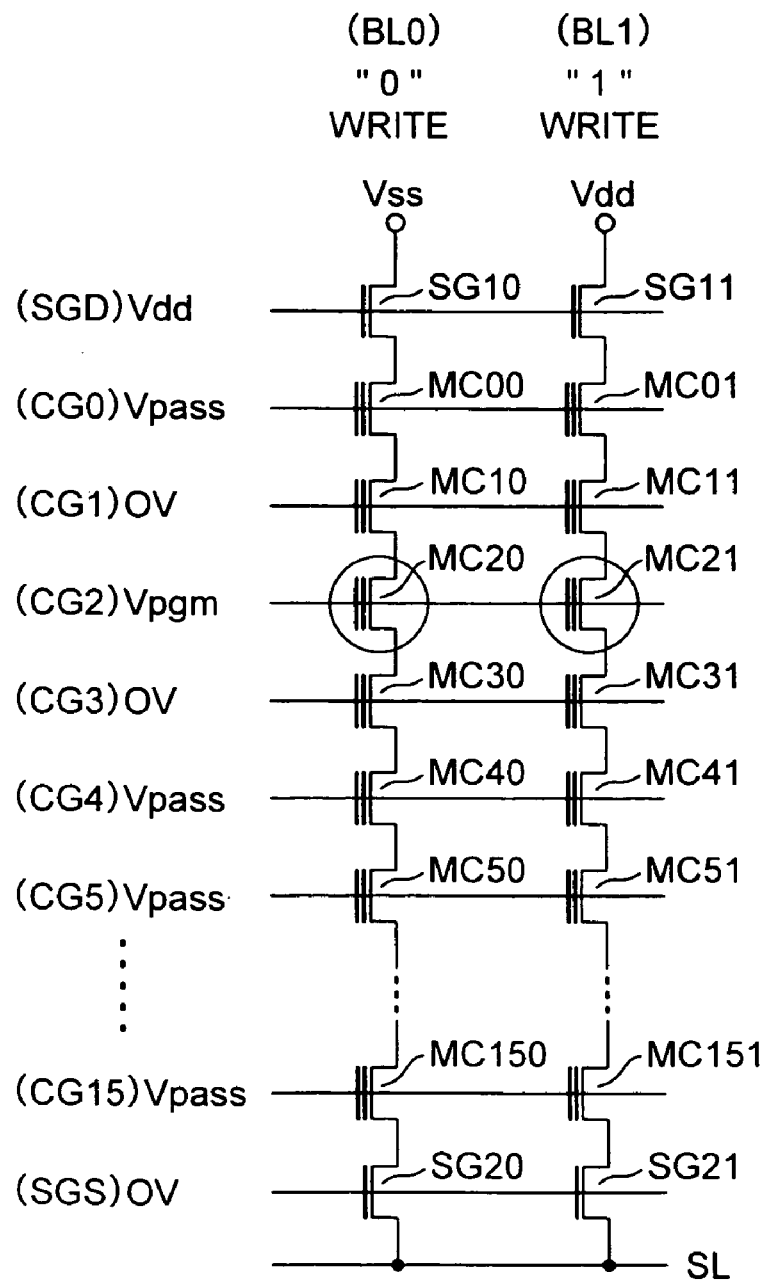
FIG. 5 illustrates a relationship among voltages applied to be the respective select and control gate lines in a write operation to be performed when a CG2 is selected in a general LSB system.
Figure 12:
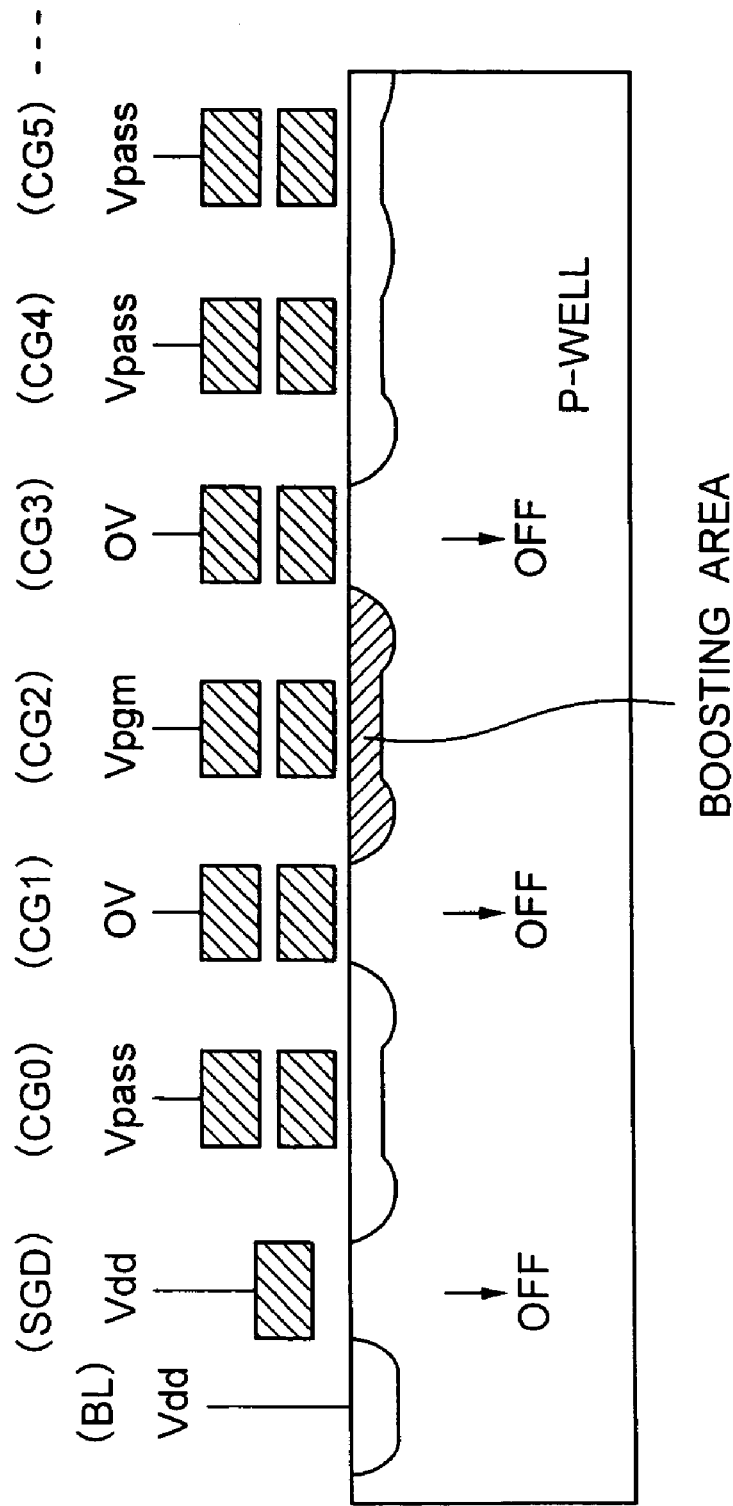
FIG. 12 illustrates boosting of a channel when a CG2 is selected in a prior art system.

For reference, write conditions necessary when the third memory transistor from the bit lines BL is selected are shown in FIG. 5 in correspondence to FIG. 3. In this case, as usual, the write voltage Vpgm is applied to the selected control gate line CG2 and Vss to the control gate lines CG1 and CG3 each adjacent to the control gate line CG2. Thus, in the NAND cell on the side of the bit line BL1 to which "1" data is applied, only the channel of the selected memory transistor MC21 is separated from the others to be placed in a floating state (FIG. 12) and boosted by capacitive coupling of the write voltage Vpgm.

Figure 6:
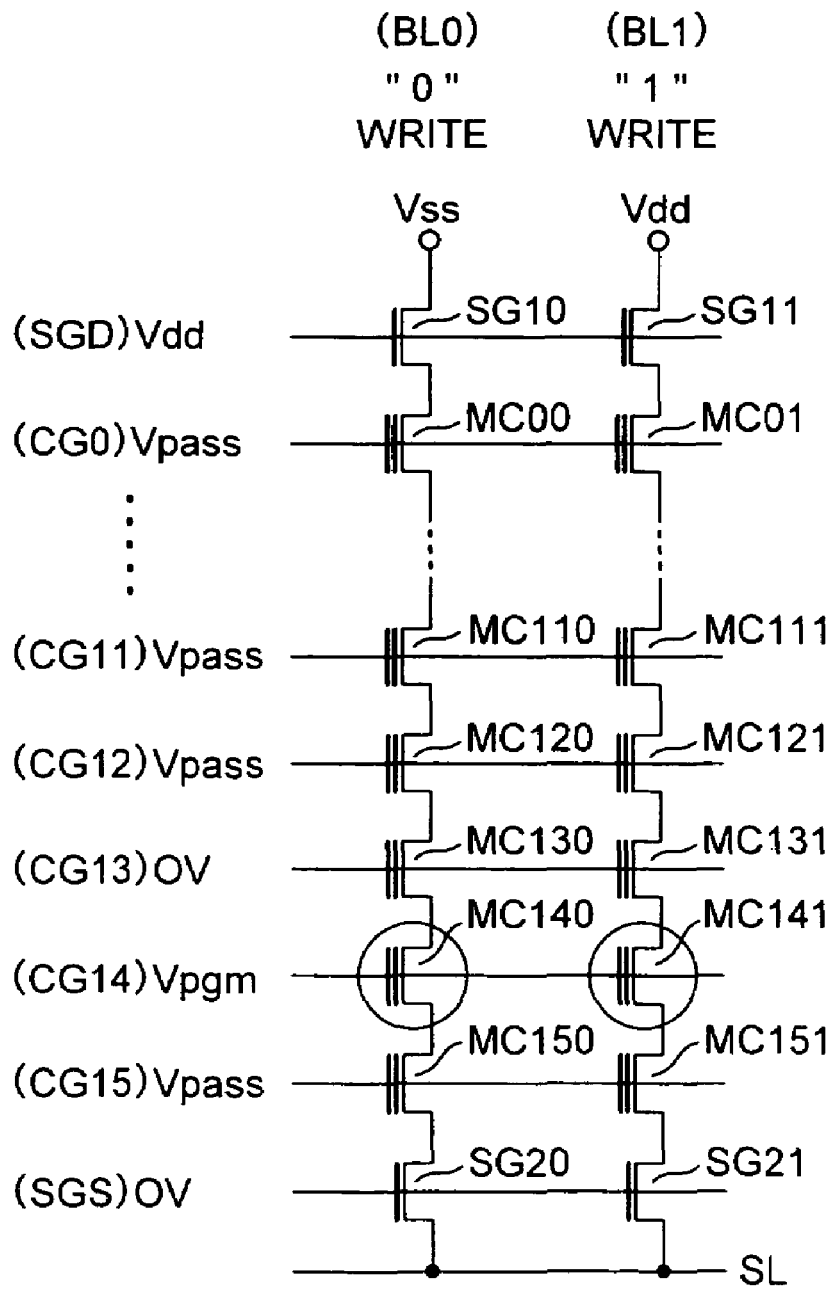
FIG. 6 illustrates a relationship among voltages applied to the respective select and control gate lines in a write operation to be performed when a CG14 is selected in the embodiment.

FIG. 6 shows writing conditions necessary when the second memory transistors MC140 and MC141 from the common source line SL is selected, in correspondence to FIG. 3. At this time, the write voltage Vpgm is applied to the selected control gate line CG14. Vss is applied to the third control gate line CG13 from the common source line SL and adjacent to the control gate line CG14 on the bit line BL side. The medium voltage Vpass is applied to the first control gate line CG15 from and adjacent to the common source line SL. The medium voltage Vpass is applied to all the remaining control gate lines.

In this case, data is already written into the memory transistors on the control gate line CG15. If the data already written into the memory transistor MC151 in the NAND cell connected to the "1" data writing bit line BL1 is "1", the memory transistor MC151 may not be turned off even when Vss is applied to its control gate. This is similar to the case of the first memory transistor MC01 when the second memory transistor from the bit line BL side is selected.

The medium voltage Vpass is applied to the first control gate line CG15 on the common source line SL side, and not Vss. Vss is applied to the third control gate line CG13 to turn off the memory transistor MC131. Thus, the channels of the selected second memory transistor MC141 and the first memory transistor MC151 are placed as a unit in a floating state to thereby boost their potentials.

In FIG. 6, the medium voltage Vpass is applied to all the non-selected control gate lines arranged on the bit line side from the control gate line CG13 to which Vss is applied. This is performed to produce a substrate bias to cut off the non-selected memory transistor MC131 securely on the "1" data applying side. Thus, the medium voltage Vpass may not be applied to all the non-selected control gate lines, but to at least one of them.

When the first control gate line CG0 from the bit line BL side is selected in the LSB system, for example, of FIG. 5, no memory transistors exist, but a select gate transistor SG11 does, on the bit line side from the first control gate line CG0. Vdd is applied to the selected gate transistor SG11 on the "1" writing bit line BL1 side and is turned off by precharging the NAND cell. Thus, only the channel of the memory transistor MC01 is boosted in a floating state. Likewise, when the first control gate line from the common source line SL is selected, the select gate transistor SG21 is off and only the channel of the memory transistor MC151 is boosted in a floating state.

Embodiment 2

In the above embodiment, one medium voltage Vpass was used. For example, in the example of FIG. 3, the medium voltage Vpass applied to the first control gate line CG0 when the second control gate line CG1 from the bit line was selected was an auxiliary voltage to boost as a unit the channel areas of the two memory transistors MC01 and MC11 on the "1" data writing side. For this reason, a specified medium voltage may be, for example, the power supply voltage Vdd or a higher appropriate value as the case may be. In this case, however, it is necessary to prevent no "0" data from being written into a non-selected memory transistor MC00 on the "0" writing bit line BL0 side. In this sense, the medium voltage should be lower than the writing voltage Vpgm.

In the example of FIG. 3, the medium voltage Vpass to be applied to the control gate lines CG3–CG15 through which the data writing was already performed is different in purpose from that applied to the control gate line CG0. That is, it is used to give an appropriate back bias to the memory transistors MC20 and MC21 to cut off the same. As described above, the medium voltage Vpass to be applied to the control gate lines CG3–CG15 may be different from that to be applied to the control gate line CG0 in FIG. 3 because of their different purposes.

Figure 7:
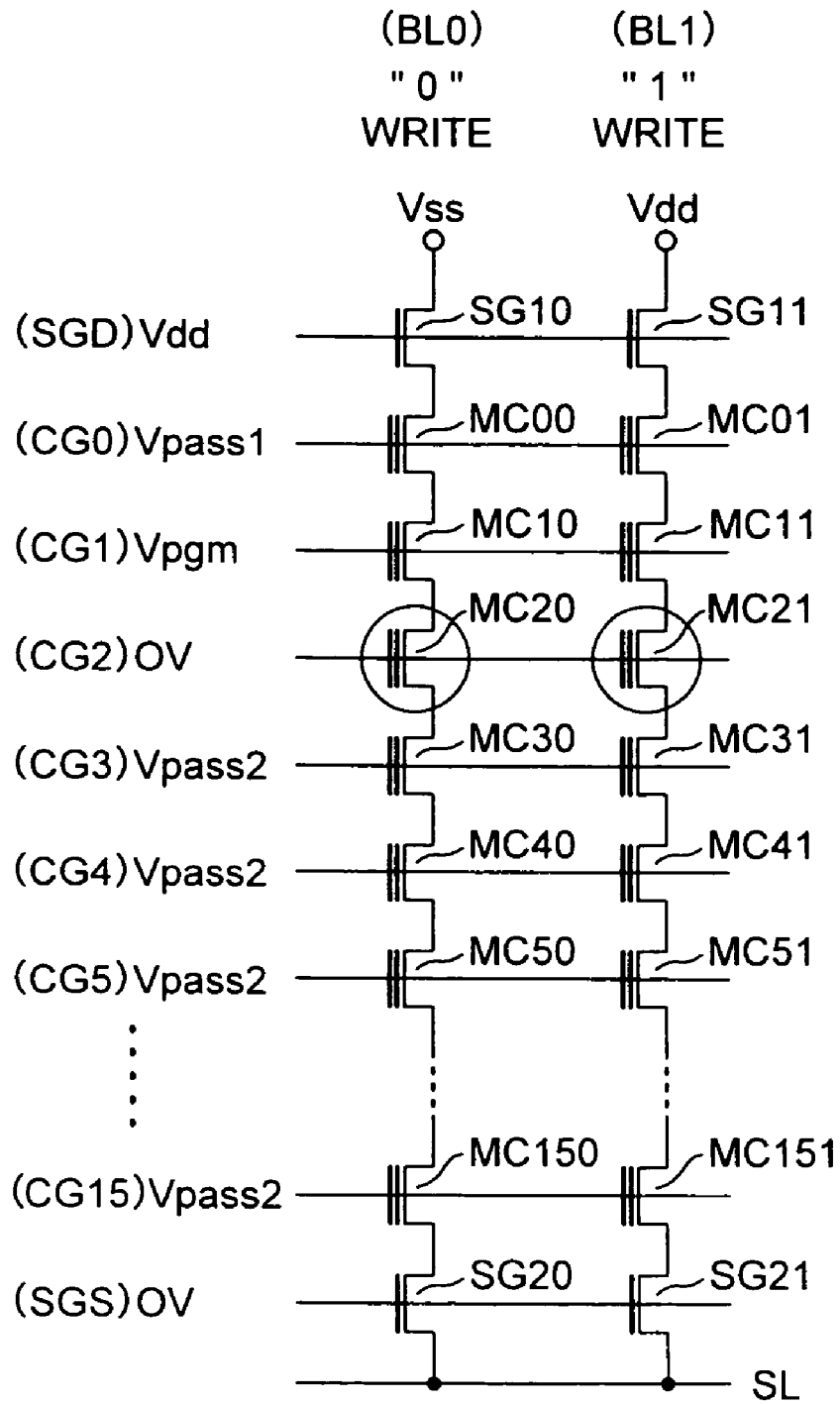
FIG. 7 illustrates a relationship among voltages applied to the respective select and control gate lines in a write operation to be performed when a CG1 (a second control gate from the bit line side) is selected in another embodiment.

Such a relationship among the voltages applied to the respective control gate lines in one embodiment is shown in FIG. 7 in correspondence to FIG. 3. In this case, a medium voltage Vpass1 is applied to the control gate line CG0 and a medium voltage Vpass2 is applied to the control gate lines CG3–CG15. In order to securely cut off non-selected memory transistors MC20 and MC21 respectively adjacent to the selected memory transistors MC10 and MC11, Vpass2 is preferably high. From this standpoint, for example, Vpass2 may be set so as to be higher than Vpass1.

In order to boost the channels of the selected memory transistors MC10 and MC11 surely and alleviate stresses on the unwritten memory transistors on the bit line side, the medium voltage Vpass1 used to aid channel boosting is high preferably. To this end, for example, Vpass1 may be set so as to be higher than Vpass2.

Figure 8:
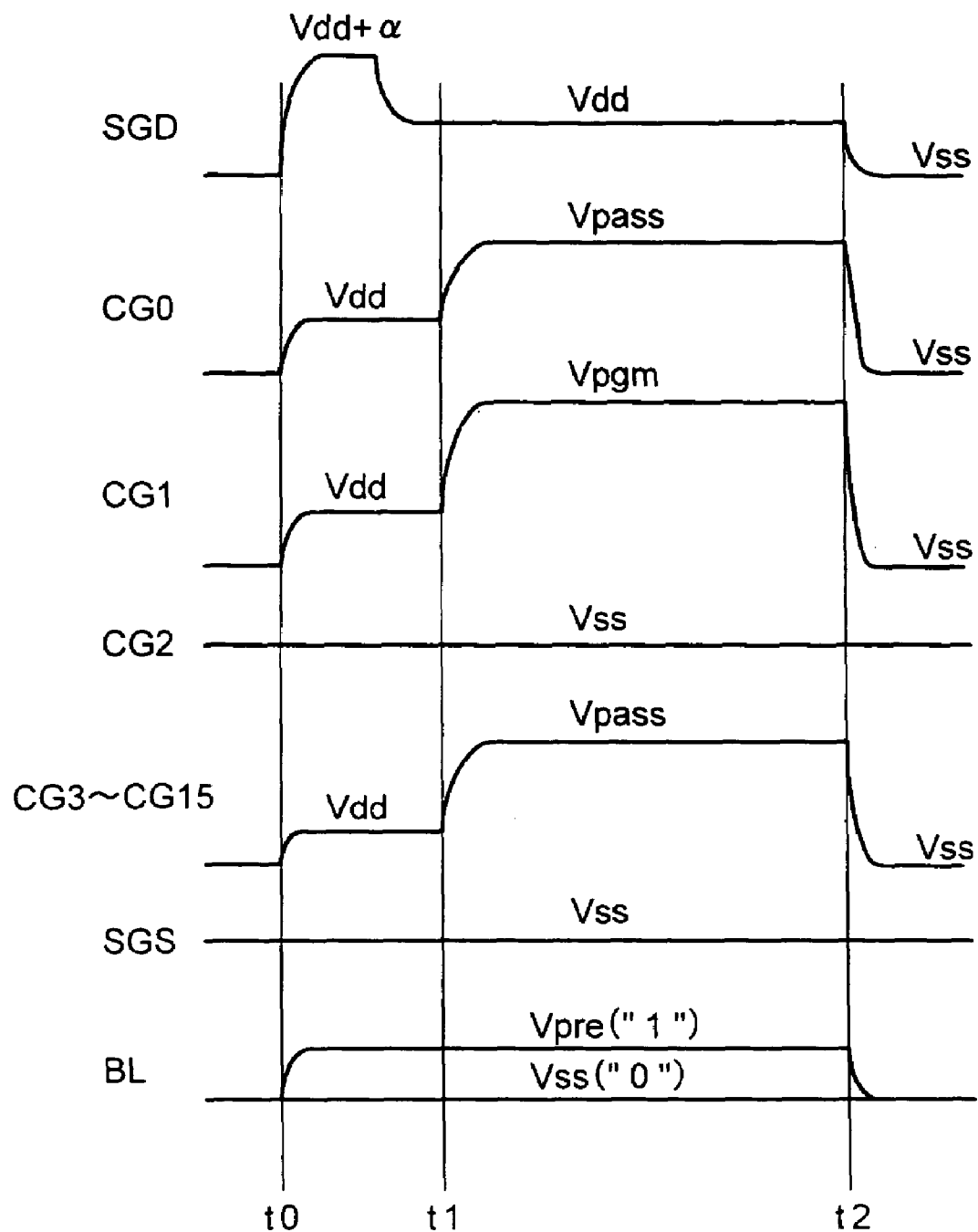
FIG. 8 illustrates timing waveforms to be used in write operations in the respective embodiments.

Timings of the write mode operations in the embodiment of FIG. 3 described so far are as shown as an example in FIG. 8. At a time t0 when the write cycle starts, Vdd+α and Vss are applied to the select gate SGD on the bit line side and to the select gate SGS on the common source line side, respectively. Vdd is applied to the selected control gate line CG1 and the control gate line CG0 adjacent to the control gate line CG1 on the bit line side. Vss is applied to the control gate line CG2 adjacent to the control gate line CG1 on the common source line side. Further, Vdd is applied to the other control gate lines CG3–CG15.

In the case of "0" write data, Vss is applied to the bit line BL whereas in the case of "1" write data, Vpre is applied to the bit line BL. A potential corresponding to the data is transferred to the channel of the memory transistor selected by the bit line data. Whwn "1" data is applied to the bit line and the potential of the select gate line SGD is then returned to Vdd, the channel precharged to about Vdd is placed in a floating state.

Then, at a time t1 a write pulse voltage Vpgm is applied to the selected control gate line CG1, so that the selected control gate line CG1 is boosted from Vdd to the write voltage Vpgm. The control gate line CG0 adjacent to the selected control gate line CG1 on the bit line side is boosted from Vdd to the medium voltage Vpass. The control gate line CG2 adjacent to the selected control gate line CG1 on the common source line side is maintained at Vss. The other control gate lines CG3–CG15 are boosted from Vdd to the medium voltage Vpass. Thus, as described above, electron injection occurs or is inhibited in the selected memory transistor depending on the data. At a time t2 the first writing is terminated.

Although not shown in FIG. 8, a write verify reading operation is performed usually after the time t2. If there is a memory transistor to which data is insufficiently written, the writing operation is performed again. As described above, by repeating the data writing and the verify reading operation, the write data is driven into a distribution of predetermined threshold voltages.

Embodiment 3

In the previous embodiments, the conventional LSB system was basically used in which when "1" data is to be written, the channel of a memory transistor adjacent to the selected memory transistor is turned off. Only when a second memory transistor from each of the bit line and the common source line of the NAND cell were selected, the basic LSB system was modified.

In contrast, one embodiment in which the basic LSB system itself is modified will be described next. A write mode to be employed in this embodiment is based on the idea that when a control gate line in the NAND cell is selected, a memory transistor that cuts off its channel to boost the channel may not be a memory transistor adjacent to the selected memory transistor, but any two memory transistors between which the selected memory transistor is disposed may be used for that purpose. In this case, a medium voltage needs to be applied to the control gate lines of non-selected memory transistors disposed along with the selected memory transistor between the channel-cutting-off memory transistors to aid boosting the channel of the selected memory transistor.

According to this embodiment, when "1" data is to be written, the channel areas of a plurality of memory transistors are boosted as a unit. The write voltage is then applied to the control gate of the selected memory transistor. The medium voltage is applied to the control gates of the non-selected memory transistors the channels of which are boosted together with the control gate of selected memory transistor. Thus, a capacitive coupling effect which will be produced by the non-selected memory transistors adjacent to the selected memory transistor is reduced compared to the general LSB system in which Vss is applied to the control gates of the non-selected memory cells adjacent to the control gates of the selected memory transistor to which the write voltage is applied.

When the non-selected control gates to which Vss is applied are adjacent to the selected control gate to which the write voltage Vpgm is applied, a rise in the floating gate of the selected memory transistor becomes insufficient due to capacitive coupling from the adjacent non-selected control gate lines to which Vss was applied. Thus, the "0" write speed may decrease. In contrast, when voltages Vss, Vpass, Vpgm, Vpass and Vss are to be applied to the arranged control gate lines, respectively, in this order where Vpgm is applied to the selected control gate line and other voltages Vss and Vpass are applied to the non-selected control gate lines, the potential of the floating gate of the selected memory transistor to which Vpgm is applied becomes high sufficiently to thereby increase the "0" write speed even when the write voltage Vpgm is the same as that used in the prior art.

Portions of the non-selected control gates lines distant from their driving ends to which Vss is applied have not necessarily fixed their potentials due to parasitic resistance and capacitance. If the adjacent control gate line has high voltage Vpgm, the potentials of the non-selected control gates will float due to their capacitive coupling. In contrast, when a control gate line to which Vpass is applied is arranged between the control gate lines to which Vss is applied and the control gate line to which Vpgm is applied, the potentials of the control gate lines to which Vss is applied are restrained from floating.

Figure 9:
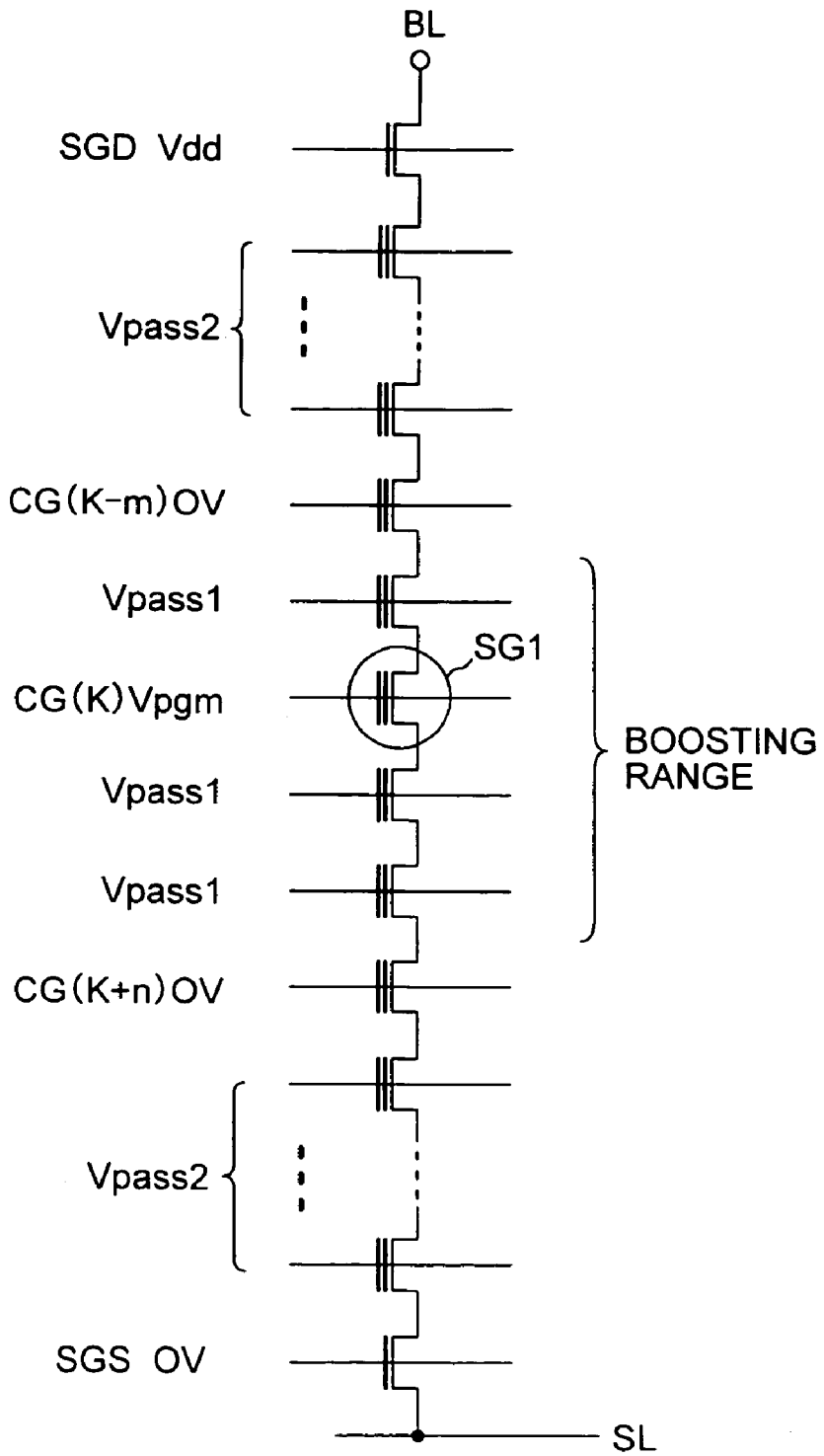
FIG. 9 illustrates a relationship among voltages to be used in write operations in another embodiment.

FIG. 9 illustrates a relationship among voltages applied in a NAND cell in this embodiment at a time of writing. FIG. 9 shows that, generally, a K-th control gate line CG (K) from the bit line side in the NAND cell is selected. As described in the previous embodiments, before data writing, the selected memory transistor and the non-selected memory transistors in the NAND cell arranged between the selected memory transistor and the bit line BL are precharged by the bit line BL to Vss or Vdd depending upon write data "0" or "1". In the case of "1" data, the selected gate transistor SG1 is turned off by precharging, and the channel of the NAND cell is placed in a floating state. The potential of the select gate line SGD on the bit line side is at Vss as in the previous embodiments.

The write voltage Vpgm is applied to the selected control gate line CG (K) to which the selected memory transistor is connected whereas Vss is applied to two control gate lines CG (K−m) and CG (K+n) between which the selected memory transistor and at least one non-selected memory transistor are disposed. Herein, m and n are each a positive integer, one of which is at least 2.

A medium voltage Vpass1 is applied to all the non-selected control gate lines arranged between the control gate lines CG (K−m) and CG (K+n) to which Vss is applied. A medium voltage Vpass2 is applied to the non-selected control gate lines arranged on the bit line BL side from the control gate line CG (K−m) and to the non-selected control gate lines arranged on the common source line SL from the control gate line CG (K+n).

As described above, FIG. 9 shows that the medium voltage Vpass2 is applied to all non-selected control gate lines of one group arranged on the bit line BL side from the control gate line CG (K−m) and to all non-selected control gate lines of another group arranged on the common source line SL side from the control gate line CG (K+n). Alternatively, the medium voltage Vpass2 may be applied to at least one of the non-selected control gate lines of each of the two groups, as in the previous embodiments. If two non-selected control gate lines to which Vpass2 is applied are each to be selected from among the non-selected control lines of a respective one of the two groups on the bit and source line sides, the non-selected control gate line adjacent to the control gate line CG (K−m), to which Vss is applied, on the bit line BL side, and the non-selected control gate line adjacent to the control gate line CG (K+n) on the common source line SL side should be preferably selected.

FIG. 9 also shows the case when m=2 and n=3. In this case, the channels of a circled memory transistor, a non-selected memory transistor adjacent to the circled memory transistor on the bit line side, and two successively arranged non-selected control memory transistors one of which is adjacent to the circled memory transistor on the common source line side are boosted as a unit. Since at this time the medium voltage Vpass1 is applied to each of the non-selected control lines to be boosted as a unit, the channels are securely boosted. The memory transistors on the control gate lines CG (K−m) and CG (K+m) to which Vss=0 V is applied for cutting off the channels are not adjacent to the selected memory transistor. Instead, there are non-selected memory transistors on an intervening non-selected control gate line(s), to which the medium voltage Vpass1 is applied, between the selected memory transistor and each of the memory transistors on the control gate lines CG (K−m) and CG (K+n). Thus, a capacitive coupling effect is reduced which would otherwise be exerted on nearby non-selected memory transistors by the write voltage applied to the selected control gate line CG (K).

Figure 10A:
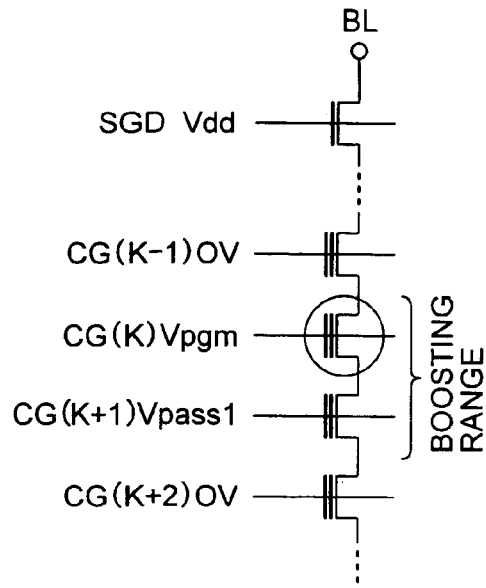
FIGS. 10(a) and 10(b) illustrate different memory transistors to each of which a reference voltage is applied.
Figure 10B:
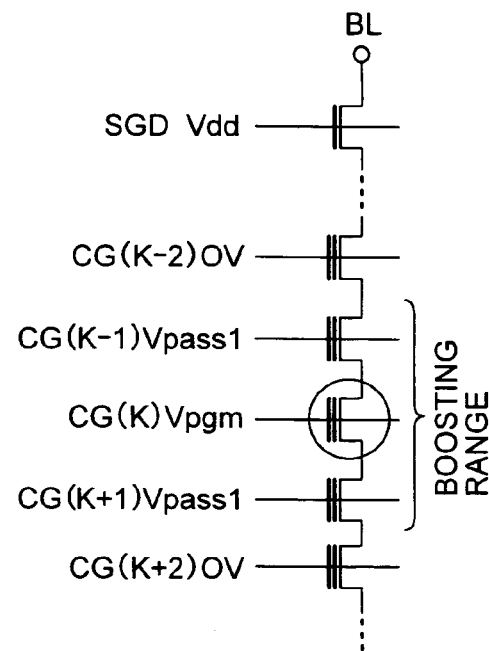

A more specified embodiment is shown in FIGS. 10(a) and 10(b). FIG. 10(a) illustrates that a selected memory transistor and an adjacent non-selected memory transistor arranged on the common source side are boosted as a unit. Thus, the write voltage Vpgm and the medium voltage Vpass1 are applied to the selected gate line CG(K) and the adjacent non-selectedgate line CG(K+1), respectively. Vss is applied to non-selected control gate lines CG (K−1) and CG(K+2) between which the selected gate line CG (K) and the adjacent non-selected gate lines CG(K−1) are arranged. Thus, the channels of the two memory transistors are boosted as a unit.

FIG. 10(a) illustrates that when the potentials of the selected control gate line and an adjacent non-selected control gate line are boosted, the medium voltage Vpass is applied to the non-selected control gate line adjacent to the selected control gate line on the common source line SL side. Alternatively, the medium voltage Vpass may be applied to the non-selected control gate line adjacent to the selected control gate line on the bit line BL side. When the problem is considered that wrong writing may occur due to a stress on the memory transistor on the selected control gate line that will be caused by applying the medium voltage Vpass to the non-selected control gate line, the medium voltage Vpass is preferably applied to the non-selected control gate line adjacent to the selected control gate line on the bit line BL side. This is because variations in the threshold due to application of Vpass do not cause so big a problem since the write voltages are applied in future to the non-selected control gate lines arranged on the bit line BL side from the selected control line although variations in the thresholds must be generally avoided, seeing that the write voltages are already applied to the non-selected control gate lines arranged on the common source line side from the selected control gate line.

FIG. 10(b) illustrates that a selected memory transistor and two non-selected memory transistors between which the selected memory transistor is arranged are boosted as a unit. Therefore, the write voltage Vpgm is applied to the selected gate line CG (K), the medium voltage Vpass1 is applied to two non-selected gate lines CG (K−1) and CG (K+1) adjacent to the selected gate line CG (K), and Vss is applied to the non-selected control gate lines CG (K−2) and CG (K+2) between which the selected and non-selected control gate lines CG (K), CG (K−1) and CG (K+1) are arranged. Thus, the channels of the three memory transistors are boosted as a unit.

When the selected control gate line is a first (K=1) one and a second (K=2) one from the bit line BL, there are no or a few non-selected control gate lines on the bit line BL side. Thus, these cases are exceptional, which are shown in FIGS. 11(a) and 11(b).

Figure 11A:
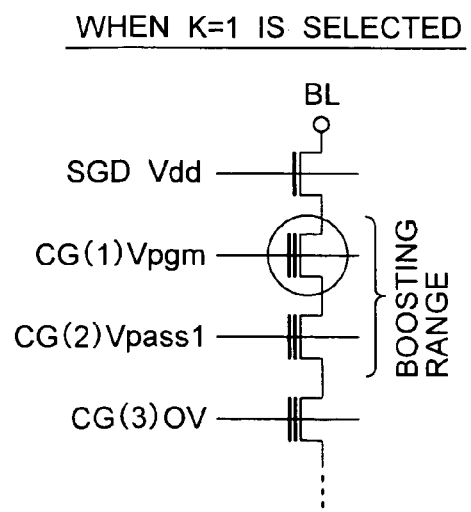
FIGS. 11(a) and 11(b) show the cases where K=1 and K=2, respectively.

FIG. 11(a) illustrates that the first (K=1) control gate line CG(1) is selected in the system of FIG. 10(a) or 10(b). At this time, Vdd is applied to the select gate line SGD on the bit line BL side to thereby cut off the bit line BL side when the bit line BL data is "1". Then, the write voltage Vpgm is applied to the selected control gate line CG(1), the medium voltage Vpass1 is applied to a non-selected control gate line CG(2) adjacent to the selected control gate line CG(1) on the common source line SL side, and Vss is applied to a control gate line CG(3) adjacent to the control gate line CG(2). There are no non-selected control gate lines, to which Vss is to be applied, on the bit line BL side. Thus, the channels of the two memory transistors on the control gate lines CG(1) and CG(2) are boosted as a unit.

Figure 11B:
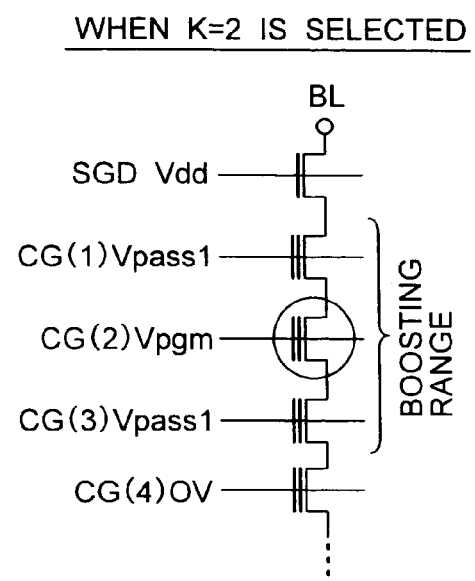

FIG. 11(b) illustrates that the second (K=2) control gate line CG(2) is likewise selected. In this case, Vdd is applied to the select gate line SGD on the bit line BL side to thereby cut off the bit line BL side when the bit line data is "1". The write voltage Vpgm is applied to the selected control gate line CG(2), the medium voltage Vpass1 is applied to non-selected control gate lines CG (1) and CG(3) each adjacent to the selected control gate line CG(2), and Vss is applied to a control gate line CG(4) adjacent to the control gate line CG(3). Also, in this case there are no non-selected control gate lines, to which Vss is to be applied, on the bit line BL side. The system of FIG. 11(b) is similar to the previous embodiment 1 in that when the second control gate line from the bit line BL side is selected, the medium voltage is applied to the first control gate line. Thus, the channels of those three memory transistors on the control gate lines CG(1), CG(2) and CG(3) are boosted as a unit.

FIGS. 11(a) and 11(b) illustrate the cases in which the first and second memory transistors, respectively, from the bit line BL side are selected. The situations also are the same when the first and second memory transistors from the common source line SL side are selected. When the first control gate line from the common source line SL side is selected, only the select gate line SGS to be turned off exists on the common source line SL side. When the second control gate line from the common source line SL side is selected, a single non-selected control gate line exists on the common source line SL side from the selected second control gate line. The medium voltage Vpass1 needs to be applied to the non-selected second control gate line.

While in FIG. 9 the medium voltage Vpass1 is illustrated as being applied to the non-selected control gate lines present between the two control gate lines to which Vss is applied, and the medium voltage Vpass2 is illustrated as being applied to the non-selected control gate lines outside the control gate lines to which Vss is applied, these two medium voltages may be either equal to, or different from, each other.

The medium voltage Vpass1 is an auxiliary voltage to be used along with the write voltage Vpgm to boost as a unit the channels of the selected memory transistor and the non-selected memory transistors around the selected memory transistor. The medium voltage Vpass2 is used as a substrate bias to cut off the channel of the memory transistor to which Vss is applied (more specifically, a source bias to that memory transistor). Therefore, the medium voltages Vpass1 and Vpass2 needs to be set to respective appropriate ones depending upon their purposes of use. The use of the same voltage for the medium voltages Vpass1 and Vpass2 serves to reduce the number of kinds of control voltages necessary for writing purposes.

In the above respective embodiments, Vss to be applied to a control gate concerned in writing is used as a reference voltage in controlling the boosting of the channel in that it cuts off the channel concerned when the data potential applied from the bit line BL is "1" whereas it allows the "0" data potential applied from the bit line BL to be transferred through the channel. However, Vss of 0 V is not necessarily required.

As described above, according to the above embodiments of the present invention, the prior-art self-boost system is improved in the NAND cell type EEPROM so that wrong writing is prevented surely even when minute cells are used in the EEPROM.

What is claimed is:

1. A method for writing data into a non-volatile semiconductor memory device which comprises a memory cell array and a voltage applying circuit, the memory cell array comprising a NAND cell, said NAND cell comprising a plurality of memory transistors connected in series from a bit line, including first, second, and third memory transistors in that order counted from a bit line side, each memory transistor comprising a charge storage layer and a control gate, one end of the NAND cell being connected to the bit line through a first select gate transistor, and the other end of the NAND cell being connected to a common source line through a second select gate transistor, the method comprising:
    selecting in a data write mode the second memory transistor;
    applying a write voltage to a control gate of the second memory transistor;
    applying a reference voltage to a control gate of the third memory transistor which is non-selected;
    applying a medium voltage, lower than the write voltage, to a control gate of the first memory transistor which is non-selected; and
    applying the medium voltage to a control gate of at least one remaining memory transistor, which is non-selected, downstream of the bit line side,
    wherein said plurality of memory transistors further includes fourth, fifth, and sixth memory transistors connected in series from the common source line such that said fourth, fifth, and sixth memory transistors have a first, second, and third position, respectively, from a common source line side, said method further comprising:
    selecting in the data write mode the fifth memory transistor;
    applying the write voltage to a control gate of the fifth memory transistor;
    applying the reference voltage to a control gate of the sixth memory transistor which is non-selected;
    applying the medium voltage to a control gate of the fourth memory transistor which is non-selected; and
    applying the medium voltage to a control gate of at least one remaining memory transistor, which is non-selected, downstream of the common source line side.

2. The method of claim 1, further comprising:
    applying the medium voltage to all respective remaining memory transistors that are non-selected in said NAND cell.

3. The method of claim 1, further comprising:
    applying the medium voltage to all respective control gates of the remaining memory transistors that are non-selected in said NAND cell.

4. A method for writing data into a non-volatile semiconductor memory device which comprises a memory cell array and a voltage applying circuit, the memory cell array comprising a NAND cell, said NAND cell comprising a plurality of memory transistors connected in series from a bit line, including first, second, and third memory transistors in that order counted from a bit line side, each memory transistor comprising a charge storage layer and a control gate, one end of the NAND cell being connected to the bit line through a first select gate transistor, and the other end of the NAND cell being connected to a common source line through a second select gate transistor, the method comprising:
    selecting in a data write mode the second memory transistor;
    applying a write voltage to a control gate of the second memory transistor;
    applying a reference voltage to a control gate of the third memory transistor which is non-selected;

applying a medium voltage, lower than the write voltage, to a control gate of the first memory transistor which is non-selected;
applying the medium voltage to a control gate of at least one remaining memory transistor, which is non-selected, downstream of the bit line side;
precharging, in the data write mode, a channel of each memory transistor of said NAND cell, depending upon data applied to a corresponding bit line, to thereby write the data into said plurality of memory transistors connected to a selected control gate line,
wherein said memory cell array comprises,
a NAND cell block comprising a plurality of said NAND cells arranged in a row direction and each NAND cell connected to a respective bit line of a plurality of bit lines,
a first selected gate line connected in common to gates of respective first select gate transistors of said plurality of NAND cells, and
a second selected gate line connected in common to gates of respective second select gate transistors of said plurality of NAND cells;
erasing collectively data stored in said plurality of memory transistors of said NAND cell block to set said plurality of memory transistors to a first data state of a low threshold, wherein said memory device has an erasure mode that is performed prior to the write mode;
performing a writing operation in the data write mode so as to precharge the channels of said plurality of memory transistors of said NAND cells in accordance with first or second write data from respective corresponding bit lines;
placing in a floating state, in each NAND cell precharged with the first data, the channel of each memory transistor connected to said selected control gate line so that, when the write voltage is applied, each said channel in the floating state of each said memory transistor is boosted due to a capacitive coupling of the control gate, to thereby inhibit a charge injection into each said charge storage layer; and
holding at a low potential, in each NAND cell precharged with the second data, the channel of each said memory transistor connected to said selected control gate line, to thereby allow charges to be injected into the charge storage layer of each said memory transistor.

5. A method for writing data into a non-volatile semiconductor memory device which comprises a memory cell array and a voltage applying circuit, the memory cell array comprising a NAND cell, said NAND cell comprising a plurality of memory transistors connected in series from a common source line, including first, second, and third memory transistors in that order counted from a common source line side, each memory transistor comprising a charge storage layer and a control gate, one end of the NAND cell being connected to a bit line through a first select gate transistor, and the other end of the NAND cell being connected to the common source line through a second select gate transistor, the method comprising:
selecting in a data write mode the second memory transistor;
applying a write voltage to a control gate of the second memory transistor;
applying a reference voltage to a control gate of the third memory transistor which is non-selected;
applying a medium voltage, lower than the write voltage, to a control gate of the first memory transistor which is non-selected;
applying the medium voltage to a control gate of at least one remaining memory transistor, which is non-selected, downstream of the common source line side;
precharging, in the data write mode, a channel of each memory transistor of said NAND cell, depending upon data applied to a corresponding bit line, to thereby write the data into said plurality of memory transistors connected to a selected control gate line,
wherein said memory cell array comprises,
a NAND cell block comprising a plurality of said NAND cells arranged in a row direction and each NAND cell connected to a respective bit line of a plurality of bit lines,
a first selected gate line connected in common to gates of respective first select gate transistors of said plurality of NAND cells, and
a second selected gate line connected in common to gates of respective second select gate transistors of said plurality of NAND cells;
erasing collectively data stored in said plurality of memory transistors of said NAND cell block to set said plurality of memory transistors to a first data state of a low threshold, wherein said memory device has an erasure mode that is performed prior to the write mode;
performing a writing operation in the data write mode so as to precharge the channels of said plurality of memory transistors of said NAND cells in accordance with first or second write data from respective corresponding bit lines;
placing in a floating state, in each NAND cell precharged with the first data, the channel of each memory transistor connected to said selected control gate line so that, when the write voltage is applied, each said channel in the floating state of each said memory transistor is boosted due to a capacitive coupling of the control gate, to thereby inhibit a charge injection into each said charge storage layer; and
holding at a low potential, in each NAND cell precharged with the second data, the channel of each said memory transistor connected to said selected control gate line, to thereby allow charges to be injected into the charge storage layer of each said memory transistor.

6. A method for writing data into a non-volatile semiconductor memory device which comprises a memory cell array and a voltage applying circuit, the memory cell array comprising a NAND cell, said NAND cell comprising a plurality of memory transistors connected in series from a bit line, including (K−m)th, Kth, and (K+n)th memory transistors in that order counted from a bit line side, each memory transistor comprising a charge storage layer and a control gate, one end of the NAND cell being connected to the bit line through a first select gate transistor, and the other end of the NAND cell being connected to a common source line through a second select gate transistor, said method comprising:
selecting in a data write mode the Kth memory transistor;
applying a write voltage to a control gate of the Kth memory transistor;
applying a reference voltage to control gates of the (K−m)th and (K+n)th memory transistors (where m and n are integers at least one of which is 2 or more) which are non-selected, to thereby turn off said (K+n)th memory transistor and to turn off or on said (K−m)th memory transistor depending upon data "1" or "0" applied to the bit line, wherein at least two memory transistors are disposed between said (K−m)th and (K+n)th memory transistors and adjacent to said selected memory transistor, one on each side of said
selected memory transistor;

applying a first medium voltage, lower than the write
voltage and higher than the reference voltage, to control gates of said at least two memory transistors which
are non-selected; and applying a second medium voltage, lower than the write
voltage and higher than the reference voltage, to a
control gate of at least one memory transistor which is
non-selected and is connected either between the bit
line side and the (K−m)th memory transistor or
between the common source line side and the (K+n)th
memory transistor.

7. The method of claim 6, further comprising:
applying the first or second medium voltage to a control
gate of a memory transistor on the bit line side from
said selected memory transistor.

8. The method of claim 6, further comprising:
applying the first or second medium voltage to a control
gate of a memory transistor on the common source line
side from said selected memory transistor.

9. The method of claim 6, further comprising:
applying the second medium voltage to control gates of
memory transistors on the bit line side from said
(K−m)th memory transistor and to control gates of
memory transistors on the common source line side
from said (K+n)th memory transistor.

10. The method of claim 6, further comprising:
setting the first medium voltage to a voltage equal to the
second medium voltage.

11. The method of claim 6, further comprising:
setting the first medium voltage to a voltage higher than
the second medium voltage.

12. The method of claim 6, further comprising:
setting the first medium voltage to a voltage lower than
the second medium voltage.

13. The method of claim 6, further comprising:
precharging, in the data write mode, a channel of each
memory transistor of said NAND cell, depending upon
data applied to a corresponding bit line, to thereby write
the data into said plurality of memory transistors connected to a selected control gate line, wherein said memory cell array comprises,
a NAND cell block comprising a plurality of said NAND
cells arranged in a row direction and each NAND cell
connected to a respective bit line of a plurality of bit
lines,
a first selected gate line connected in common to gates of
respective first select gate transistors of said plurality of
NAND cells, and
a second selected gate line connected in common to gates
of respective second select gate transistors of said
plurality of NAND cells.

14. A method for writing data into a non-volatile semiconductor memory device comprising a memory cell array
which comprises a NAND cell, said NAND cell comprising
a plurality of memory transistors connected in series from a
bit line, including first, second, and third memory transistors
in that order counted from a bit line side, each memory
transistor comprising a charge storage layer and a control
gate, one end of the NAND cell being connected to the bit
line through a first select gate transistor, and the other end of
the NAND cell being connected to a common source line
through a second select gate transistor, said method comprising:
    selecting in a data write mode the second memory transistor;

applying a write voltage to a control gate of the second
memory transistor;

applying a reference voltage to a control gate of the third
memory transistor which is non-selected;

applying a first medium voltage, lower than the write
voltage and higher than the reference voltage, to a
control gate of the first memory transistor which is
non-selected; and applying a second medium voltage, lower than the write
voltage and higher than the reference voltage, to a
control gate of at least one remaining memory transistor, which is non-selected, downstream of the bit line
side, wherein said plurality of memory transistors further
includes fourth, fifth, and sixth memory transistors
connected in series from the common source line such
that said fourth, fifth, and sixth memory transistors
have a first, second, and third position, respectively,
from a common source line side, said method further
comprising:

selecting in the data write mode the fifth memory transistor;

applying the write voltage to a control gate of the fifth
transistor;

applying the reference voltage to a control gate of the
sixth memory transistor which is non-selected;

applying the first medium voltage to a control gate of the
fourth memory transistor which is non-selected, downstream of the common line side; and applying the second medium voltage to a control gate of
at least one remaining memory transistor, which is
non-selected, downstream of the common source line
side.

15. The method of claim 14, further comprising:
applying the second medium voltage to all respective
remaining memory transistors that are non-selected in
said NAND cell.

16. The method of claim 14, further comprising:
applying the second medium voltage to control gates of
all remaining memory transistors, which are non-selected, of said NAND cell.

17. The method of claim 14, further comprising:
setting the first medium voltage equal to the second
medium voltage.

18. The method of claim 14, further comprising:
setting the first medium voltage higher than the second
medium voltage.

19. The method of claim 14, further comprising:
setting the first medium voltage lower than the second
medium voltage.

20. The method of claim 14, further comprising:
precharging, in the data write mode, a channel of each
memory transistor of said NAND cell, depending upon
data applied to a corresponding bit line, to thereby write
the data into said plurality of memory transistors connected to a selected control gate line, wherein said memory cell array comprises,
a NAND cell block comprising a plurality of said NAND
cells arranged in a row direction and each NAND cell
connected to a respective bit line of a plurality of bit
lines,
a first selected gate line connected in common to gates of
respective first select gate transistors of said plurality of
NAND cells, and
a second selected gate line connected in common to gates
of respective second select gate transistors of said
plurality of NAND cells.

21. The method of claim 20, further comprising:

erasing collectively data stored in said plurality of memory transistors of said NAND cell block to set said plurality of memory transistors to a first data state of a low threshold, wherein said memory device has an erasure mode that is performed prior to the write mode;

performing a writing operation in the data write mode so as to precharge the channels of said plurality of memory transistors of said NAND cells in accordance with first or second write data from respective corresponding bit lines;

placing in a floating state, in each NAND cell precharged with the first data, the channel of said memory transistor connected to said selected control gate line so that, when the write voltage is applied, each said channel in the floating state of each said memory transistor is boosted due to a capacitive coupling of the control gate, to thereby inhibit a charge injection into each said charge storage layer; and holding at a low potential, in each NAND cell precharged with the second data, the channel of each said memory transistor connected to said selected control gate line, to thereby allow charges to be injected into the charge storage layer of each said memory transistor.

* * * * *